United States Patent [19]
Nishino et al.

[11] Patent Number: 5,880,926
[45] Date of Patent: Mar. 9, 1999

[54] ELECTRONIC DEVICE WITH MOUNTING STRUCTURE

[75] Inventors: Seiichi Nishino, Katsuyama; Kozaburo Okubo; Hiroyuki Nakagawa, both of Ono; Takashi Yokoyama; Takeru Nonoguchi, both of Kaneoka, all of Japan

[73] Assignee: Nichicon Corporation, Kyoto, Japan

[21] Appl. No.: 844,496

[22] Filed: Apr. 18, 1997

[30] Foreign Application Priority Data

| Apr. 19, 1996 | [JP] | Japan | 8-122585 |
| Apr. 24, 1996 | [JP] | Japan | 8-128989 |
| May 16, 1996 | [JP] | Japan | 8-147988 |
| May 16, 1996 | [JP] | Japan | 8-147991 |
| Jul. 15, 1996 | [JP] | Japan | 8-205280 |

[51] Int. Cl.$^6$ ............... H01G 2/10; H01G 9/04
[52] U.S. Cl. ............ 361/517; 361/520; 361/531; 361/540; 361/535
[58] Field of Search ............... 361/309, 310, 361/517, 518, 519, 520, 531, 533, 534, 535, 536, 537, 540, 807, 808, 809, 820, 821

[56] References Cited

FOREIGN PATENT DOCUMENTS

| SHO 59-211213 | 11/1984 | Japan . |
| SHO 62-186519 | 8/1987 | Japan . |
| HEI 3-25393 | 6/1991 | Japan . |

*Primary Examiner*—Kristine Kincaid
*Assistant Examiner*—Anthony Dinkins
*Attorney, Agent, or Firm*—William H. Murray

[57] ABSTRACT

An electrolytic capacitor device includes a capacitor which has a capacitor element and leads extending from one end of the element, and a square mounting board for use in mounting the capacitor device on a printed circuit board. The mounting board is connected to the one end of the capacitor. The leads are inserted into openings extending through the mounting board. The mounting board has parallel slits extending from the openings to one side edge of the mounting board. Each slit is wider in its open end at the one side edge of the mounting board than the diameter of the associated opening. The bottom surface of the mounting board has metal plate terminals which extend from the openings to different side edges of the mounting board. The terminals have rising portions extending upward along the inner walls of the slits and the openings. The leads have tip ends welded in their peripheries to the rising portions. The top surface of the mounting board has a U-shaped stop opening toward the one side edge.

18 Claims, 2 Drawing Sheets

ELECTRONIC DEVICE WITH MOUNTING STRUCTURE

This invention relates to a "leadless" electronic device, and, in particular, a "leadless" capacitor device which includes a capacitor having leads and a board for mounting such capacitor on a printed circuit board.

BACKGROUND OF THE INVENTION

Automation systems have been employed for mounting electronic components on a printed circuit board. Such automated mounting requires electronic components having flat terminals in place of leads, i.e. "leadless" electronic components, because positioning of electronic components having leads by machinery is difficult. Thus, techniques for modifying electronic components with leads to "leadless" components have been developed.

A cylindrical aluminum electrolytic capacitor essentially has a structure in which two leads extend from one end of the capacitor. Some references disclose a cylindrical aluminum electrolytic capacitor device having flat terminals suitable for mounting on a printed Circuit board in which an insulating mounting board is attached to a bottom surface of a capacitor. The insulating mounting board is square or generally square with a side substantially as long as the diameter of a cylindrical casing of the capacitor.

For example, Japanese Unexamined Patent Publication (KOKAI) No. SHO 59-211213 discloses a cylindrical aluminum electrolytic capacitor device in which two leads of a capacitor respectively are inserted to extend through two openings in a mounting board, and are so bent as to locate in two respective grooves formed In the outward facing (bottom) surface of the mounting board. The bent portions of the leads are used as terminals to be soldered to conductors on a printed circuit board.

Japanese Examined Utility Model Publication (KOKOKU) No. HEI 3-25393 discloses that the bottom surface of a mounting board is provided with metallic terminal members having grooves in which bent portions of leads are placed, and the bent portions are soldered to the metallic terminal members in the grooves.

Such prior arts, however, have disadvantages, Leads must be bent at the right angle at the exits of respective openings in a mounting board. When the leads are bent, they are pulled, which may result in poor connection to electrodes in a casing. For reducing the tension to the leads, the leads each may be provided with a notch at a location at which that lead is to be bent. Such notches, however, reduce mechanical strength of the leads, which may cause the leads to be cut at the notches by vibrations or shocks.

In addition, it is difficult to insert the leads through the openings by using machinery. Failure in inserting the leads through the openings causes the leads to be caught between the bottom surface of the capacitor and the inner (top) surface of the mounting board. Such leads cannot form terminals for connection to a printed circuit board. Capacitors and mounting boards between which one of leads remains caught are joined together by the other lead which is successfully inserted into the opening and in engagement with the mounting board may be supplied as superficially complete capacitor devices.

Japanese Unexamined Patent Publication (KOKAI) No. SHO 62-186519 discloses a technique to eliminate the necessity of bending leads. According to this technique, openings in a mounting board have a larger diameter on its side facing a capacitor than on its outward facing surface. Short leads of the capacitor are inserted into the openings and the tip ends of the leads are connected to metallic terminal members on the outward facing surface of the mounting board.

This technique, however, does not completely eliminate difficulty in inserting the leads into the openings in the mounting board, and the strength of connection between the leads and the metallic terminal members is not sufficient.

An object of the present invention is to provide an improved "leadless" electronic device, e.g. a "leadless" aluminum electrolytic capacitor device, including an electronic component and a mounting board connected to the electronic component. A capacitor device according to the present invention is free from the disadvantages stated above and can be manufactured by an automation system without need for inserting leads of a capacitor through small openings in a capacitor mounting board.

SUMMARY OF THE INVENTION

An electronic device according to the present invention includes an electronic component, a component mounting board of insulating material, and metallic terminals which are disposed on the bottom surface of the mounting board and electrically insulated from each other. The electronic component includes a functional element placed in a casing of the electronic component, and a plurality of leads which are connected to the functional element and project out of an end or the electronic component. The end of the electronic component from which the leads project is contacted with the component mounting board. The leads are inserted into respective generally round openings extending through the mounting board to the respective metallic terminals. Slits are formed through the mounting board, which extend from the respective openings to one side edge of the mounting board. The slits are spaced by a distance equal to the distance between the leads and extend in substantially parallel with each other.

Other features of the electronic device according to the present invention will be understood from the accompanying drawings and the following description made with reference to them.

DETAILED DESCRIPTION OF PREFERRED EMBODIMENTS

Figure 3:
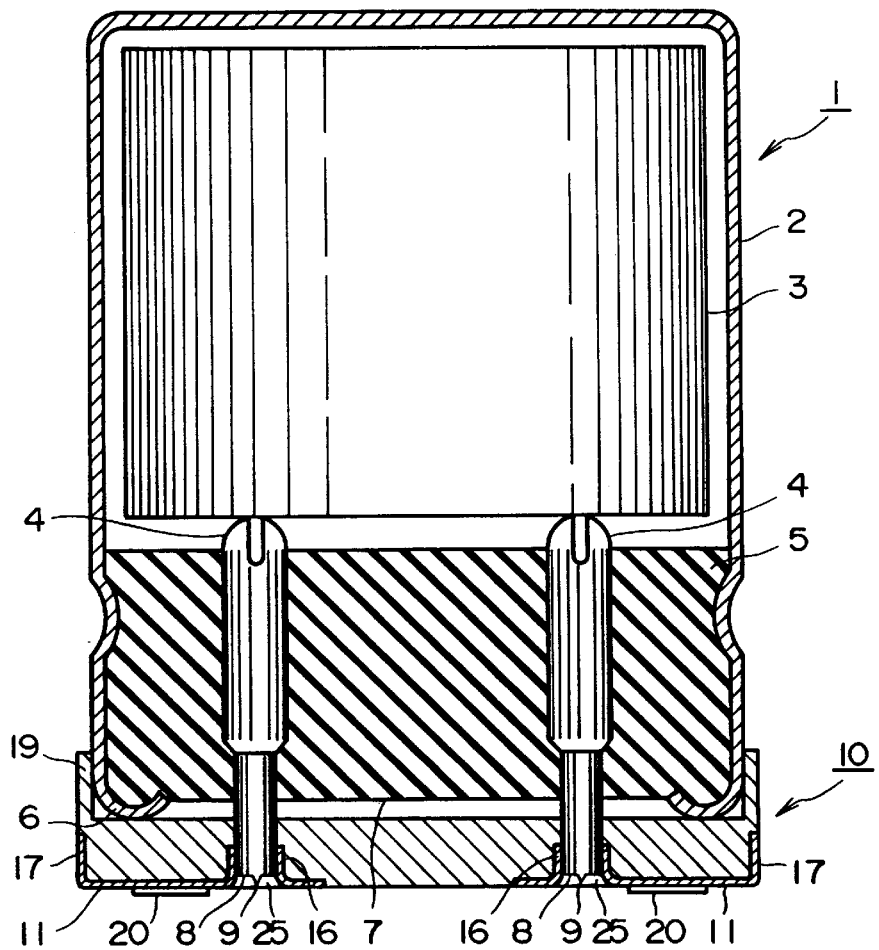
FIG. 3 is an enlarged partially cross-sectional view along the line III—III FIG. 2.
Figures 1, 2:
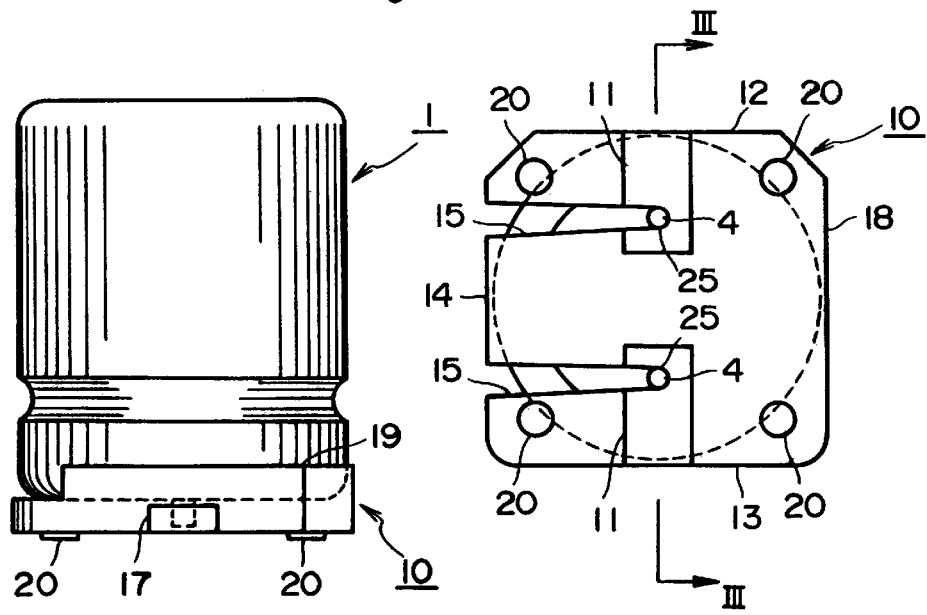
FIG. 1 is a front view of a cylindrical aluminum electrolytic capacitor device according to one embodiment of the present invention, including an aluminum electrolytic capacitor and a component mounting board connected to the bottom of the capacitor.
FIG. 2 is a bottom view of the capacitor device of FIG. 1, showing the positions of slits and metallic terminals of the mounting board, and the leads of the capacitor.

In FIG. 1, a reference numeral 1 denotes a cylindrical aluminum electrolytic capacitor, and 10 denotes a component mounting board of insulating material which is connected to the bottom of the capacitor 1. As shown in FIG. 3, the capacitor 1 includes a capacitor element 3 contained in a cylindrical aluminum casing 2. Leads 4, 4 connected to electrodes of the element 3 pass through sealing 5 and project out of the sealing 5. An edge 6 of the open end (bottom end) of the casing 2 is bent inwardly. A reference numeral 7 denotes the outer surface of the sealing 5.

As shown in FIG. 2, the component mounting board 10 is generally square in shape. The bottom surface of the mounting board 10 is provided with a pair of metal plate terminals 11, 11. Generally round openings 25, 25 are formed to extend through the mounting board 10 and the metal plate terminals 11, 11. The metal plate terminals 11, 11 extend from the openings 25, 25 to opposing side edges 12 and 13 of the generally square mounting board 10. The mounting board 10 is provided with slits 15, 15 extending through the mounting board 10. The slits 15, 15 extend in parallel with each other from the respective openings 25, 25 to another sidle edge 14. The diameter of the openings 25, 25 is substantially equal to the diameter of leads 4, 4, while the width of the slits 15, 15 at the side edge 14 is sufficiently wider than the lead diameter. The metal plate terminals 11, 11 have internal rising portions 16, 16 extending upward along the inner walls of the openings 25, 25 and the portions of the inner walls of the slits 15, 15 contiguous to the openings 25, 25, and external rising portions 17, 17 extending upward along the side edges 12 and 13 of the mounting board 10. The metal plate terminals 11, 11 are formed integral with the mounting board 10 by insert molding.

Figures 4, 6:
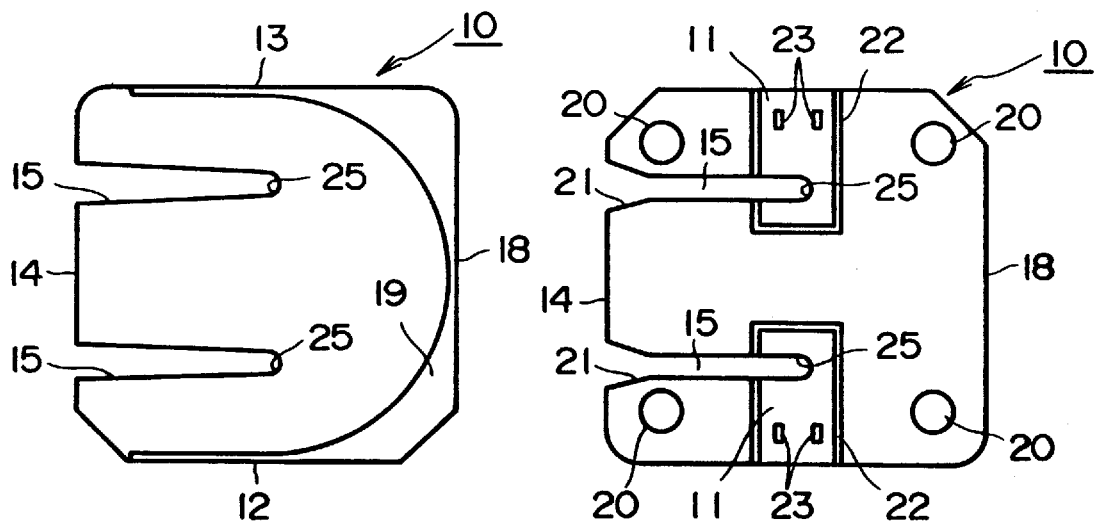
FIG. 4 is a plan view of the component mounting board shown in FIG. 1.
FIG. 6 is a bottom view of another example of a mounting board.

As shown in FIG. 4, the top surface, i.e. the surface facing the capacitor 1, of the mounting board 10 has an integrally-molded stop 19 which extends upward from portions of the mounting board 10 along three side edges 12, 18 and 13. The stop 19 has a generally U-shaped inner wall. An open end of the stop 19 has a width substantially equal to the diameter of the capacitor 1. The deepest portion of the U-shaped stop 19, which is furthest from the side edge 14, has a radius of curvature substantially equal to the radius of the capacitor 1.

Figure 5:
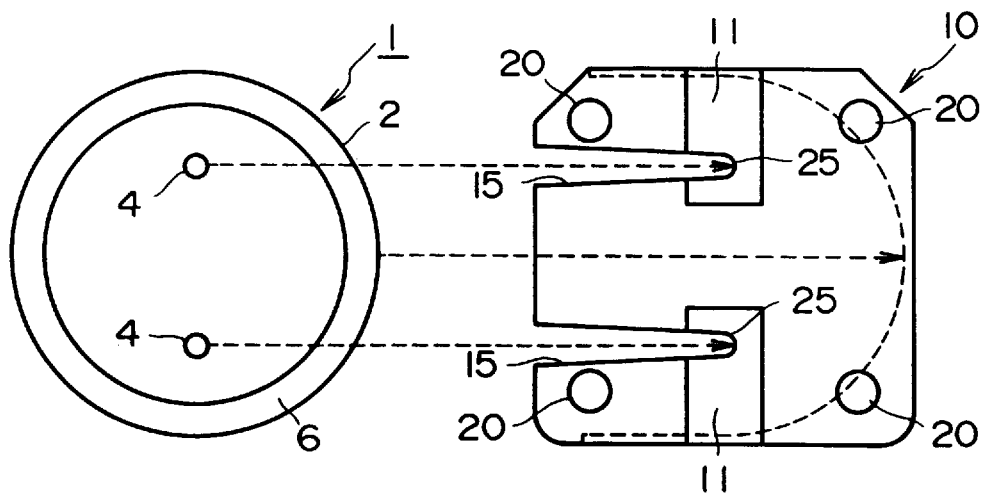
FIG. 5 shows how to connect the capacitor and the mounting board to form the cylindrical aluminum electrolytic capacitor device shown in FIG. 1.

The capacitor 1 is connected to the mounting board 10 in the following manner. The capacitor 1 is so positioned that the leads 4, 4 are placed at the respective open ends of the slits 15, 15. Then, the capacitor 1 is slid, in the direction indicated by arrows in FIG. 5, toward the deepest portion of the U-shaped stop 19 until the outer surface portion of the casing 2 contacts the deepest portion of the stop 19, with the bottom edge 6 of the casing 2 kept in contact with the top surface of the mounting board 10 With the outer surface portion of the casing 2 engaging with the stop 19, the leads 4, 4 enter into the openings 25, 25, as shown in FIG. 2. Thus, the stop 19 prevents the leads 4, 4 from being subjected to an excessive strain when the capacitor 1 is connected to the mounting board 10 by an automation system.

The leads 4, 4 are so cut beforehand that their tip ends 8, 8 are slightly spaced upward from the bottom surface, i.e. outward facing surface of the metal plate terminals 11, 11, as shown in FIG. 3, when the leads 4, 4 are placed in the openings 25, 25. The tip ends 8, 8 of the leads 4, 4 are laser-beam welded to the internal rising portions 16, 16 of the metal plate terminals 11, 11, whereby a "leadless" capacitor device suitable for use with a printed circuit board is completed.

It has been found that in order to obtain good welding, it is better to locate the tip ends 8, 8 slightly above the bottom surfaces of the metal plate terminals 11, 11, than at the same level as the bottom surface so that gaps between the peripheries of the tip ends 8, 8 and the metal plate terminals 11, 11 can be prevented from being formed.

Cutting of the leads 4, 4 causes burrs 9, 9 on the tip ends 8, 8, which could interfere with mounting of the capacitor device on a printed circuit board (not shown). The location of the tip ends 8, 8 as stated above prevents the burrs 9, 9 from such interference.

Protrusions 20, 20, 20, 20 of proper height are formed on the bottom surface of the mounting board 10, e.g. at the corners of the board 10. Such protrusions 20, 20, 20, 20 provide a gap between the mounting board 10 and the printed circuit board, which facilitates introduction of molten solder into the spaces between the metal plate terminals 11, 11 and conductors on the printed circuit board. The external rising portions 17, 17 of the metal plate terminals 11, 11 facilitate visual inspection of the soldering of the metal plate terminals 11, 11 to the conductors on the printed circuit board.

Another type of mounting board 10 is shown in FIG. 6. Components with the same reference numerals used in FIGS. 1–5 and FIG. 6 are similar components or have similar functions. Each slit 15 of the mounting board 10 has a portion extending from the assciated opening 25 which has a constant width equal to the diameter of the associated opening 25, and a portion 21 extending from the constant width portion to the edge 14 which has a continuously increasing width. The metal plate terminals 11, 11 have their peripheral portions provided with grooves 22, 22. During soldering, heated air flows in the grooves 22, 22, to thereby accelerate heating of the metal plate terminals 11, 11. The metal plate terminals 11, 11 have, in proper positions thereof, apertures 23, 23, . . . , into which insulating material of the mounting board 10 enters when the board 10 is insert molded, so that the strength of connection between the metal plate terminals 11, 11 and the insulating material can be improved. Instead of forming the aperture 23, small projections may be formed, which are embedded in the insulating material of the board 10 by insert molding.

The metal plate terminals 11, 11 can be disposed on the mounting board 10 not only by insert molding, but also by other appropriate processing such as application of a conductive coating material and metal vapor deposition.

Though the present invention has been described, being embodied in an aluminum electrolytic capacitor device, the invention can be embodied in other electronic devices, too.

What is claimed is:

1. An electronic device comprising an electronic component, a component mounting board of insulating material having opposing first and second major surfaces, said first major surface facing said electronic component, and a plurality of conductive terminals spaced from each other on said second major surface of said mounting board, said electronic component comprising a functional element, a casing containing said functional element, and a plurality of leads which extend outward of one end of said functional element and project beyond one end of said casing, said mounting board being in contact with said one end of said casing, said leads being inserted into respective ones of a plurality of openings extending through said mounting board from said first major surface thereof to respective ones of said conductive terminals on said second major surface of said mounting board;

wherein slits are formed to extend through said mounting board from said first major surface to said second major surface, said slits extending from respective ones of said openings to a first edge of said mounting board.

2. The electronic device according to claim 1 wherein said openings are round, and each of said openings has a diameter substantially equal to the diameter of a corresponding one of said leads.

3. The electronic device according to claim 1 wherein said openings are round, and the width of each of said slits at said first edge of said mounting board is larger than the diameter of a corresponding one of said openings.

4. The electronic device according to claim 1 wherein each of said conductive terminals extends in a different direction than said slits to an edge of said mounting board other than said first edge.

5. The electronic device according to claim 4 wherein said second major surface of said mounting board is provided with grooves each extending from one of said edges corresponding to each conductive terminal along a boundary of that conductive terminal.

6. The electronic device according to claim 1 wherein said mounting board has a substantially rectangular shape, said first edge being a first side edge of the mounting board, said conductive terminals extending to opposing second and third side edges of said mounting board, respectively.

7. The electronic device according to claim 1 wherein said conductive terminals are formed by pressing metal plates.

8. The electronic device according to claim 7 wherein each of said conductive terminals has an internal rising portion which extends along an inner wall of a corresponding one of said slits and an inner wall of a corresponding one of said openings.

9. The electronic device according to claim 7 wherein said conductive terminals extend in different directions than said slits to edges of said mounting board other than said first edge, each of said conductive terminals having an external rising portion extending along a side surface of said mounting board at a corresponding one of said edges.

10. The electronic device according to claim 1 wherein said insulating material of said mounting board is synthetic resin, and said conductive terminals are pressed metal plates, said mounting board being formed by insert molding with said conductive terminals.

11. The electronic device according to claim 1 wherein each of said leads is electrically and mechanically connected to a corresponding one of said conductive terminals in a corresponding one of said openings.

12. The electronic device according to claim 11 wherein said leads are welded to the respective conductive terminals.

13. The electronic device according to claim 1 wherein each of said leads has its tip end set slightly back from an outward facing surface of a corresponding one of said conductive terminals.

14. The electronic device according to claim 1 wherein said conductive terminals are pressed metal plates, each conductive terminal having an internal rising portion which extends along an inner wall of a corresponding one of said slits and an inner wall of a corresponding one of said openings, each of said leads having its tip end set slightly back from an outward facing surface of a corresponding one of said conductive terminals, said tip end being welded at its periphery to said internal rising portion of said corresponding conductive terminal.

15. The electronic device according to claim 1 wherein said mounting board has a plurality of protrusions having such height that a gap can be formed between said conductive terminals and conductors on a printed circuit board on which said electronic device is to be mounted, for facilitating introduction of molten solder into a space between said conductive terminals and said conductors on said printed circuit board.

16. The electronic device according to claim 15 wherein said mounting board has a substantially rectangular shape, said protrusions being located near the respective corners of said board.

17. The electronic device according to claim 1 wherein said mounting board has a stop projecting from said first major surface of said mounting board, said stop being formed at a location along the edge of said mounting board opposite to said first edge, said stop contacting a part of a sidewall of said electronic component.

18. The electronic device according to claim 1 wherein said mounting board has a stop projecting from said first major surface of said mounting board, said stop being formed at a location along each of the edges other than said first edge, said stop contacting a part of a sidewall of said electronic component.

* * * * *